United States Patent [19]

Kamikawa

[11] Patent Number: 5,381,808
[45] Date of Patent: Jan. 17, 1995

[54] CLEANING TREATMENT APPARATUS

[75] Inventor: Yuji Kamikawa, Uto, Japan

[73] Assignees: Tokyo Electron Kabushiki Kaisha, Tokyo; Tokyo Electron Saga Kabushiki Kaisha, Saga, both of Japan

[21] Appl. No.: 28,807

[22] Filed: Mar. 10, 1993

[30] Foreign Application Priority Data

Mar. 12, 1992 [JP] Japan .................... 4-087516

[51] Int. Cl.6 ............................. B08B 3/04
[52] U.S. Cl. ...................... 134/61; 134/114; 134/902
[58] Field of Search ............. 134/902, 61, 66, 114

[56] References Cited

U.S. PATENT DOCUMENTS 4,777,970 10/1988 Kusuhara .................. 134/66
4,955,402 9/1990 Miranda ................. 134/902 X

FOREIGN PATENT DOCUMENTS 256326 11/1991 Japan ..................... 134/902

OTHER PUBLICATIONS

Japanese Patent Laid-Open Publication No. 61-256734 (Kokai) published on Nov. 14, 1986.

Japanese Patent Laid-Open Publication No. 4-61231 (Kokai) published on Feb. 27, 1992.

Japanese Utility Laid-Open Publication No. 2-116736 (Jitsuyo Kokai) published on Sep. 19, 1990.

*Primary Examiner*—Philip R. Coe
*Attorney, Agent, or Firm*—Beveridge, DeGrandi, Weilacher & Young

[57] ABSTRACT

The present invention relates to a cleaning treatment apparatus wherein two neighboring treatment chambers are allowed to communicate through a communicating opening provided in a lower portion of a separating wall that separates the two treatment chambers, and a movable treatment tank containing a treatment liquid is arranged in a movable manner within the two treatment chambers. The liquid contained in the movable treatment tank and the separating wall are in contact and the two treatment chambers are covered. This configuration ensures that the atmospheres in the two treatment chambers are mutually isolated so that the movable treatment tank can be used in both treatment chambers, the overall apparatus can be made more compact, and also the amount of treatment liquid used can be reduced. In addition, there is no need for a wafer conveyor means, so throughput can also be improved.

12 Claims, 6 Drawing Sheets

FIG. I

CLEANING TREATMENT APPARATUS

BACKGROUND OF THE INVENTION

The present invention relates to a cleaning treatment apparatus which cleans an object to be treated (such as a semiconductor wafer) with treatment liquids.

In general, a cleaning treatment apparatus is used during the semiconductor fabrication process to remove chemicals and impurities that have attached to the surfaces of the semiconductor wafers. This cleaning treatment apparatus cleans the surfaces of the semiconductor wafer by subjecting the semiconductor wafer to a sequence of various processes such as ammonia treatment, water washing, and hydrofluoric acid treatment.

A conventional example of such a cleaning treatment apparatus is provided with a row of a plurality of cleaning treatment chambers in which are contained treatment tanks such as an ammonia treatment tank, a water washing treatment tank, and a hydrofluoric acid treatment tank. The semiconductor wafer that is the object to be treated is held and supported by a conveyor means in such a manner that it is conveyed into and out of each of these treatment chambers and is cleaned thereby (as disclosed in, for example, Japanese Utility Model Laid-Open Publication No. 116736-1991). In order to prevent the atmosphere within each of the treatment chambers from leaking out, the periphery of each treatment tank is compartmentalized into a vessel, and each vessel is provided with an opening through which the semiconductor wafers are conveyed in and out. This opening is closed by a opening/closing means such as a shutter, or it is isolated by an air curtain, and thus the atmosphere within each cleaning treatment chamber is prevented from leaking out.

However, since a large number of treatment steps is required, not only must this conventional type of cleaning treatment apparatus be provided with a large number of treatment tanks arrayed for use in the various processes, openings having some means of isolation (such as shutters or air curtains) must be provided between the treatment tanks. Therefore, at the very least there are problems in that the apparatus body is bulky and a large installation space must be provided, and also the treatment efficiency is reduced because the object to be treated is conveyed into and out of the treatment chambers by the conveyor means.

In addition, with this type of cleaning treatment apparatus, in order to convey the semiconductor wafer into and out of treatment chambers with different atmospheres by the conveyor means, chemicals that had operated on the semiconductor wafer and the conveyor means in the previous treatment and are adhered thereto could drip during the conveying within the opening or onto the shutter. Chemicals that drip within the opening could penetrate the seal portion thereof and could even penetrate as far as the shutter drive portion to corrode the drive portion, or dirt generated within the drive portion of the shutter could adhere to the seal portion. This causes problems such that dirt adhering to this seal portion could leak into the opening, dirtying the semiconductor wafers or lowering the yield of semiconductor wafers.

SUMMARY OF THE INVENTION

The present invention was designed in light of the above situation and has as its objectives the provision of a cleaning treatment apparatus that is intended to be a smaller device and is also intended to improve the isolation between atmospheres of treatment chambers and the throughput thereof.

In order to achieve the above objectives, the cleaning treatment apparatus of the present invention comprises a cleaning treatment apparatus that has a plurality of treatment chambers having treatment tanks containing treatment liquids, and the object to be treated undergoes cleaning treatment by being immersed into the treatment liquids in the treatment tanks in sequence. This cleaning treatment apparatus is characterized in that two neighboring treatment chambers are made to communicate with each other through a communicating opening provided in a lower portion of a separating wall that isolates the two treatment chambers, the arrangement being such that a treatment tank can move between the two treatment chambers, and the treatment liquid in the treatment tank and the separating wall are in direct contact so that the two treatment chambers are isolated from one another.

According to the cleaning treatment apparatus of the present invention, configured as described above, the two neighboring treatment chambers communicate with one another through the communicating opening provided in a lower portion of the separating wall that separates the two treatment chambers, the treatment tank can move between the two treatment chambers, and the treatment liquid in the treatment tank and the separating wall are in direct contact. Therefore, the two treatment chambers are isolated from one another, the treatment tanks of the two treatment chambers can be replaced with a single treatment tank used in common, the entire apparatus can be made more compact, and also the amount of treatment liquid used can be reduced. In addition, there is no need for a wafer conveyor means, so throughput can also be improved.

DETAILED DESCRIPTION OF THE PREFERRED EMBODIMENTS

An embodiment of the present invention will be described below with reference to the accompanying diagrams. The description of this embodiment concerns the application to a cleaning apparatus for semiconductor wafers, but it will be obvious to those skilled in the art that the present invention is not limited thereto.

Figure 1:
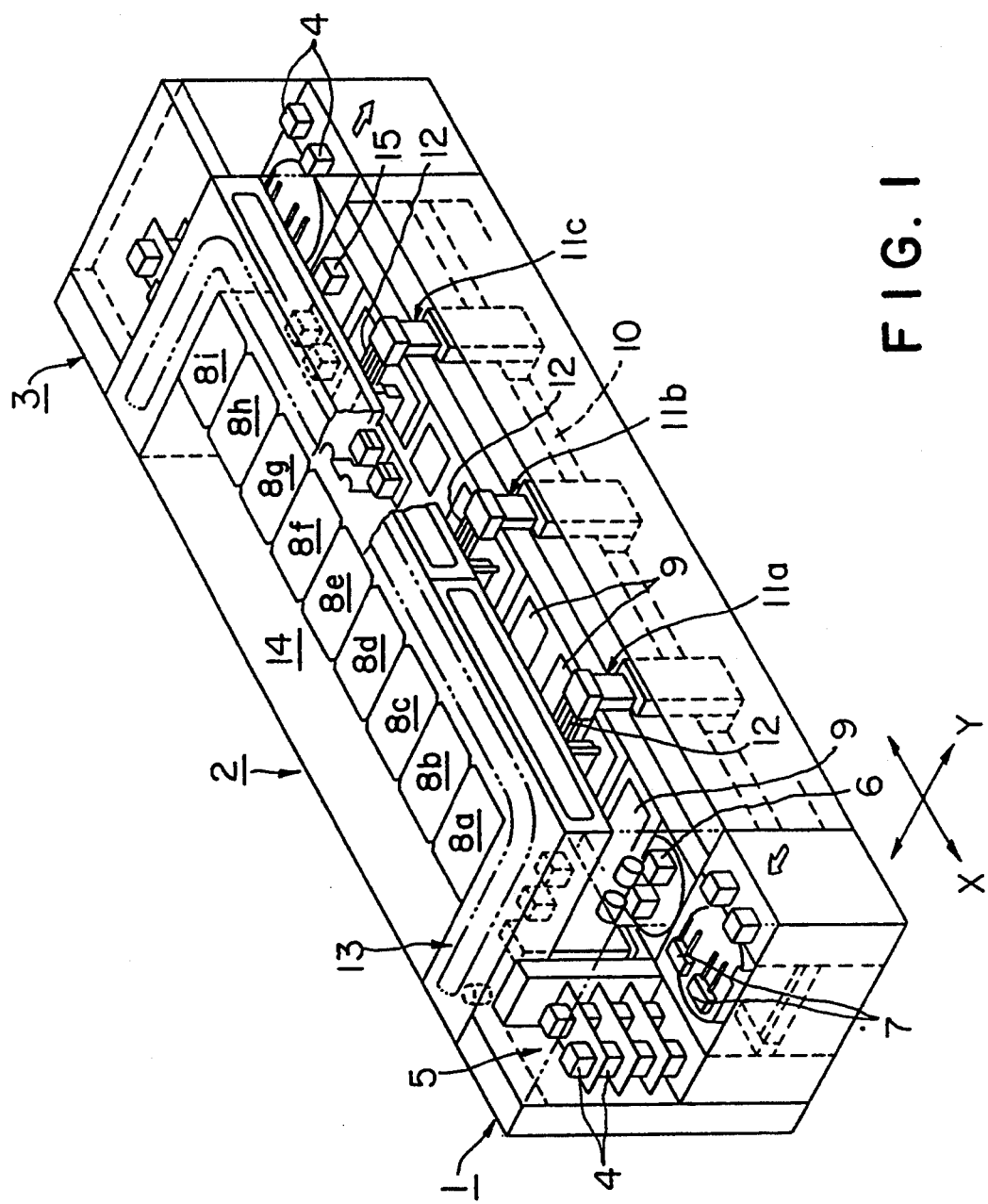
FIG. 1 is an abbreviated perspective view of the entire configuration of a semiconductor wafer cleaning apparatus having the cleaning treatment apparatus of the present invention.

The main parts of the cleaning apparatus for semiconductor wafers of the present invention are configured of a conveyor input portion 1 that contains semiconductor wafers which are objects to be treated that have not yet been treated (hereinafter referred to simply as wafers), a cleaning treatment portion 2 that cleans the wafers, and a conveyor output portion 3 that contains the wafers that have been treated, as shown in FIG. 1.

The conveyor input portion 1 is provided with a holding portion 5 for carriers 4 that contain the wafers; a loader portion 6 that performs actions such as taking wafers from the carriers 4, aligning their orientation flats, and detecting the number of wafers; and carrier conveyor arms 7 that move the carriers 4 that have been conveyed in from outside to the holding portion 5 and move the carriers 4 between the holding portion 5 and the loader portion 6.

The cleaning treatment portion 2 is provided with treatment tanks 9 in corresponding cleaning treatment chambers 8a to 8i (hereinafter referred to as treatment chambers) that are arrayed in sequence from the conveyor input portion 1 to the conveyor output portion 3 as a first chuck washing and drying treatment chamber 8a, a first chemical treatment chamber 8b, a first water washing treatment chamber 8c, a second water washing treatment chamber 8d, a second chemical treatment chamber 8e, a third water washing treatment chamber 8f, a fourth water washing treatment chamber 8g, a second chuck washing and drying treatment chamber 8h, and a wafer drying treatment chamber 8i. Along the side of the cleaning treatment portion 2 are provided wafer conveyor arms 11 (11a to 11c, in this case) mounted in a slidable manner on a sliding guide portion 10 that is provided along the treatment chambers 8a to 8i, so as to be free to move horizontally in the directions X and Y and also in the direction perpendicular thereto. Wafer chucks 12 that support a plurality of wafers arrayed at a suitable spacing from one another are provided in each of the wafer conveyor arms 11, and the wafers supported in the wafer chucks 12 are conveyed as appropriate between a suitable selection of the treatment chambers 8a to 8i. Note that a carrier conveyor portion 13 is provided above the cleaning treatment portion 2 to convey empty and full carriers. A treatment liquid and piping region 14 that contains piping and tanks containing treatment liquids such as chemicals is provided in the rear surface side of the cleaning treatment portion 2.

An unloader portion 15 that performs tasks such as aligning the orientation flats of wafers, detecting the number of wafers, and inserting wafers into carriers is provided in the conveyor output portion 3.

The description below concerns the cleaning treatment apparatus of the present invention, which is incorporated in the cleaning treatment portion 2 of the wafer cleaning apparatus configured as described above. This description concerns a case in which the cleaning treatment apparatus of the present invention is incorporated in the third water washing treatment chamber 8f and the fourth water washing treatment chamber 8g.

Figure 2:
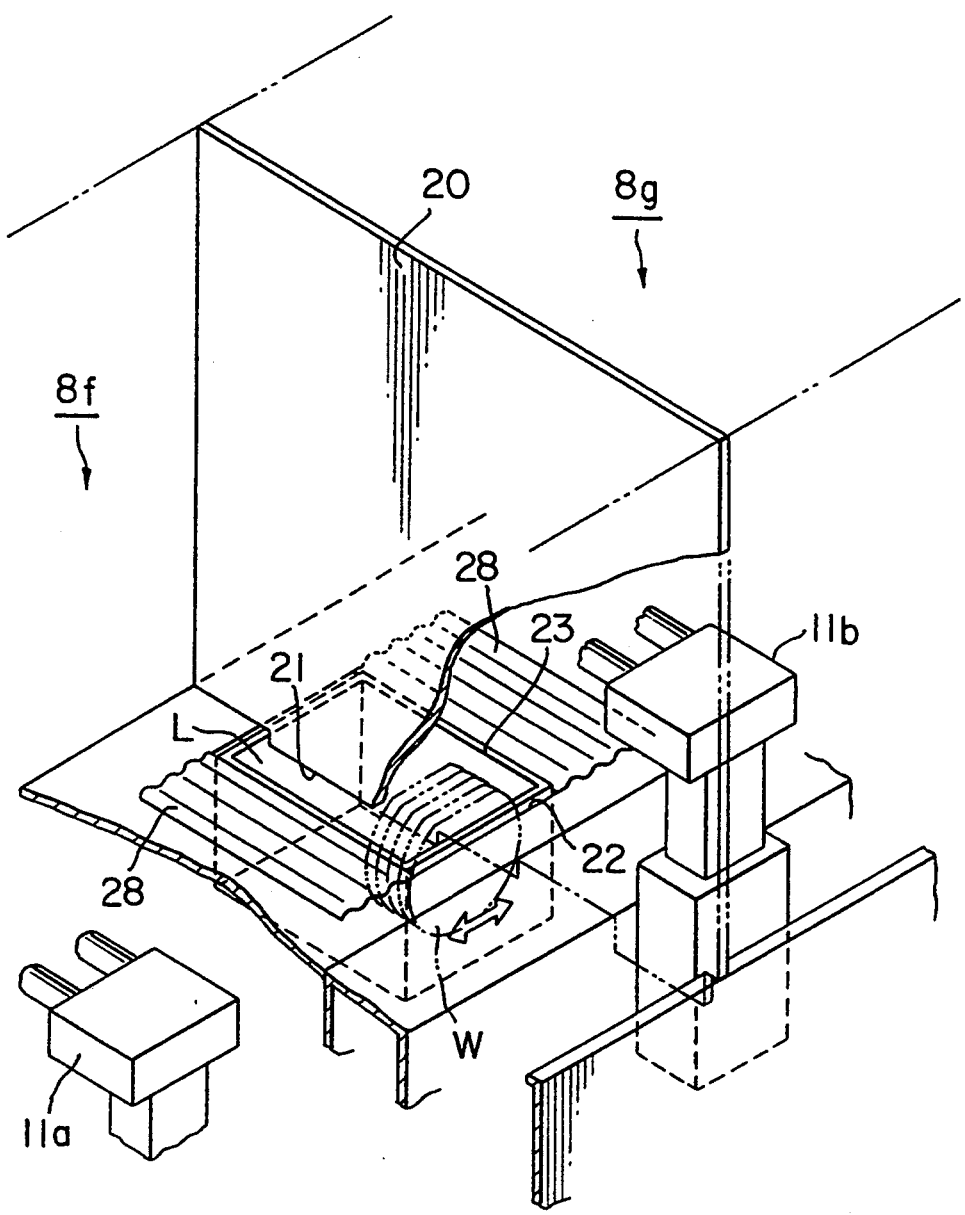
FIG. 2 is an abbreviated perspective view of the cleaning treatment apparatus of the present invention.

The cleaning treatment apparatus of the present invention is provided in a communicating fashion with a treatment tank arrangement portion 22 in a lower portion of the third water washing treatment chamber 8f and the fourth water washing treatment chamber 8g (hereinafter referred to simply as treatment chambers), through a communicating opening 21 formed in a lower portion of a separating wall 20 dividing the two treatment chambers 8f and 8g, as shown in FIG. 2. The configuration is such that a treatment liquid L contained in a movable treatment tank 23 and an edge portion of the separating wall 20 are in contact with each other, so that the two treatment chambers 8f and 8g are isolated from one another.

The position of the lower edge of the separating wall 20 is freely adjustable in the vertical direction, and fumes from the two treatment chambers 8f and 8g are vented into the factory's exhaust gases.

Figure 3:
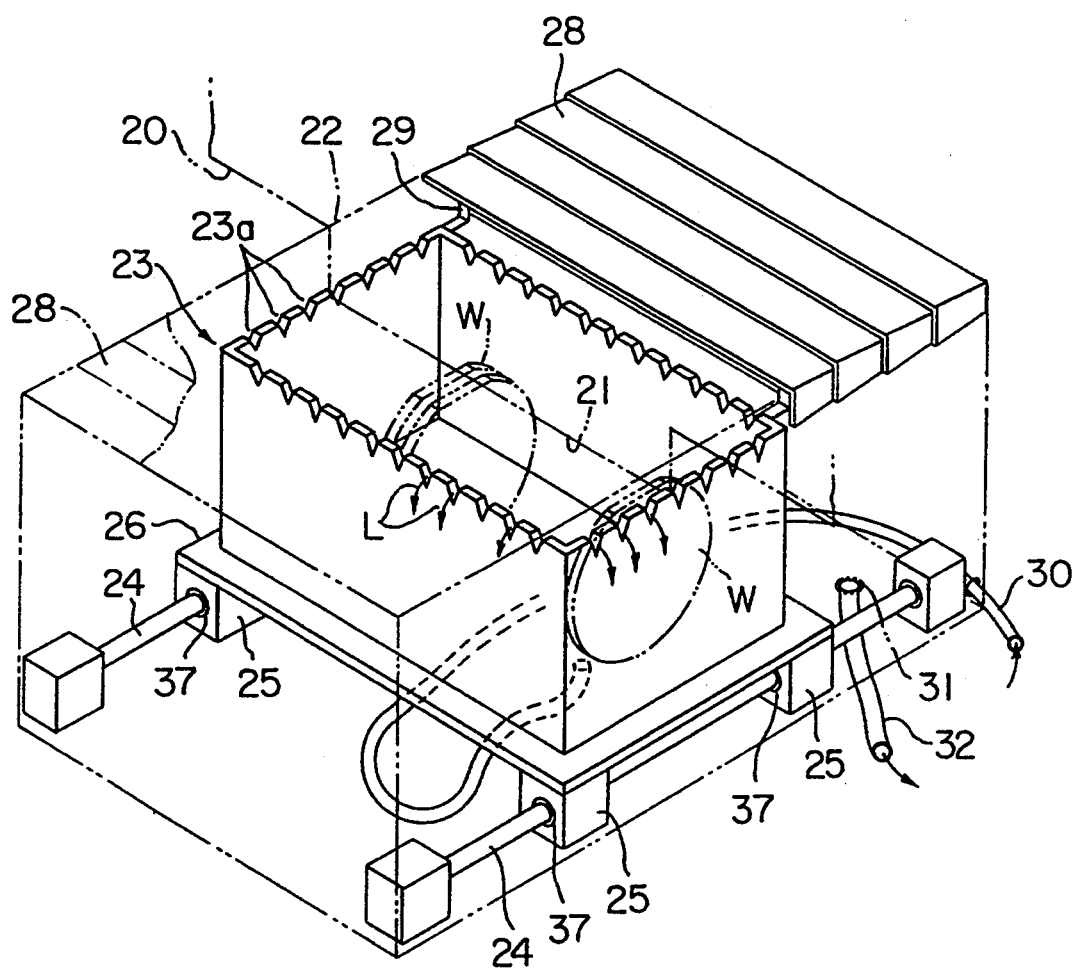
FIG. 3 is a perspective view of vital parts of the cleaning treatment apparatus of the present invention.

The movable treatment tank 23 is constructed of a corrosion resistant material such as quartz plates that have notches 23a in the opening edges thereof to allow the treatment liquid L to overflow, as shown in FIG. 3. However, if there is no particular requirement for corrosion resistance, the tank could be constructed of inexpensive PVC.

The movable treatment tank 23 is arranged on a movable stage 26 having sliding elements 25 that engage in a freely slidable manner with a pair of guide shafts 24 arranged in positions corresponding to the two sides and extending along the lower portion of the cleaning treatment portion 22, and is driven to move in the horizontal direction between the two treatment chambers 8f and 8g by a drive motor 27 that is described below. Two freely expandable shutters 28 are provided, one end of each being fixed outside the movable treatment tank 23, the other end thereof being fixed by brackets 29 to an edge of an opening of the movable treatment tank 23 facing the two treatment chambers 8f and 8g. In this way, the region outside the two treatment chambers 8f and 8g is isolated by the shutters 28 in accordance with the movement of the movable treatment tank 23.

A treatment liquid supply pipeline 30 connected to the lower portion of the movable treatment tank 23 is configured of a freely expandable Teflon (tradename) water supply tube. It is drawn out from a corner portion of the treatment tank arrangement portion 22 and is connected to a treatment liquid supply source that is not shown in the figure. A drain hole 31 is also provided in the lower portion of the treatment tank arrangement portion 22 in such a manner that the treatment liquid drains out through a drainpipe 32 connected to the drain hole 31 after it has been used.

Figure 4A:
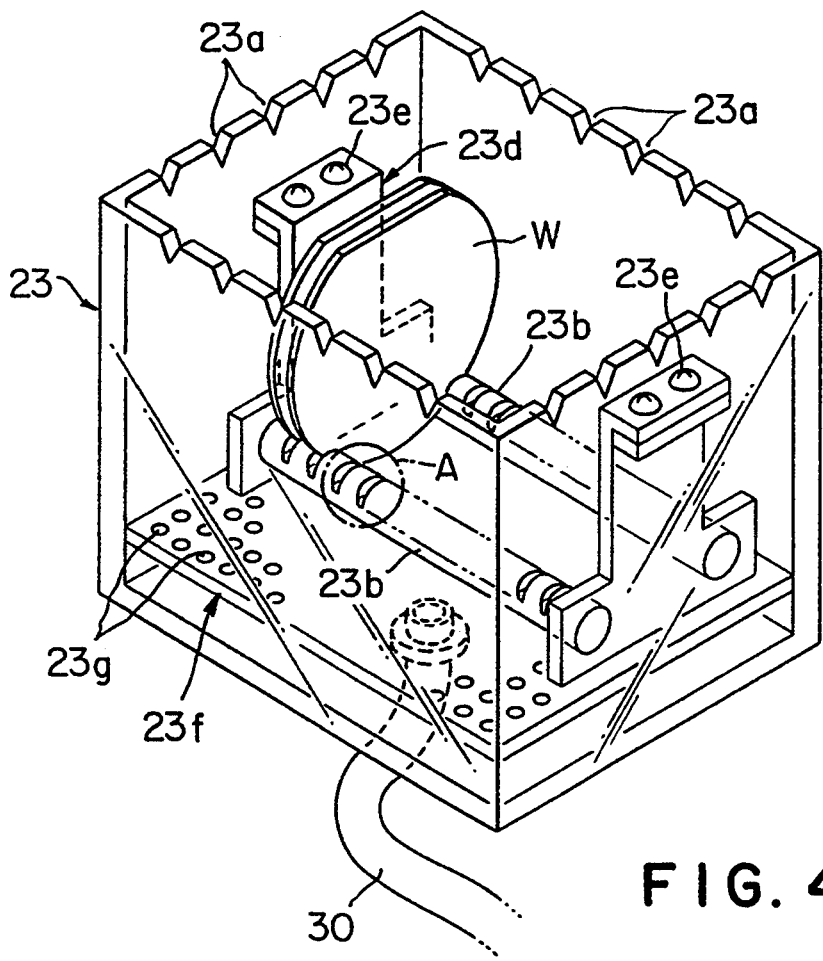
FIG. 4A is a perspective view of a treatment tank of the cleaning treatment apparatus of the present invention.
Figure 4B:
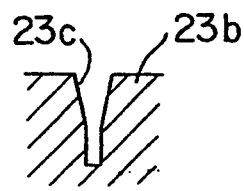
FIG. 4b is a partial cross-section of a support bar provided in the treatment tank of the invention.
Figure 5:
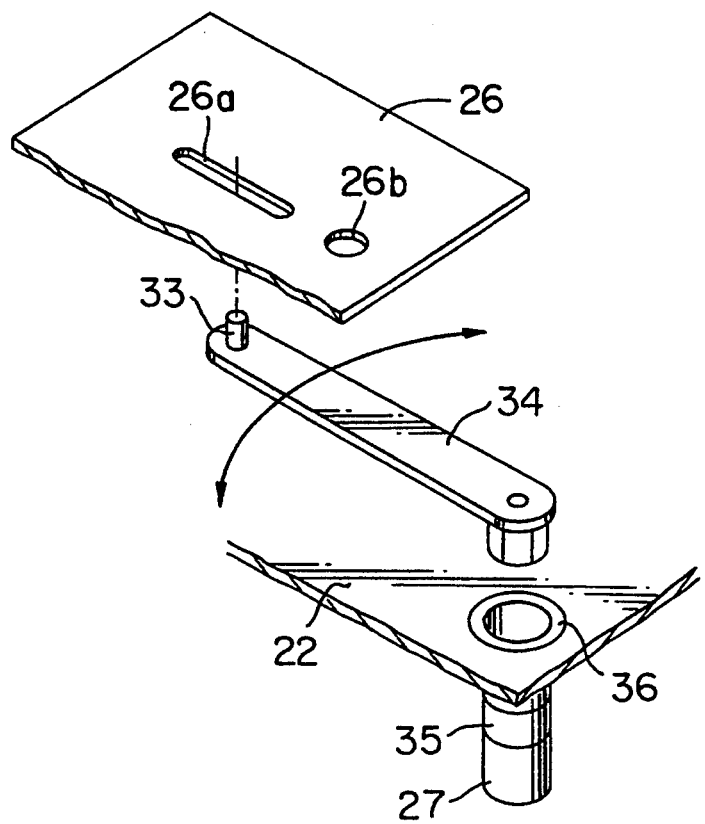
FIG. 5 is an exploded perspective view of a drive means for moving a treatment tank in the cleaning treatment apparatus of the present invention.

FIG. 4A is a perspective view of the body of the movable treatment tank 23 shown in FIG. 3. Within the movable treatment tank 23, a quartz boat 23d is attached to the inner walls of the movable treatment tank 23 by Teflon screws 23e. Two support bars 23b are fitted in a lower portion of the quartz boat 23d, and a large number of notches 23c are cut perpendicular to the axial direction of the support bars 23b, as shown in the detail cross-section of FIG. 4B, in such a manner that wafers W can be mounted lengthwise therein.

The movable stage 26 is provided with an elongated guide hole 26a, a slider pin 33 provided at one end of an operation arm 34 fits so as to be able to slide in the elongated guide hole 26a, and the other end of the operation arm 34 is linked to a drive motor 27 that can rotate in either direction. The movable stage 26 is moved by the rotational drive of the drive motor 27 in such a manner that the movable treatment tank 23 is able to reciprocate between the two treatment chambers 8f and 8g. In this case, the rotational speed of the drive motor 27 is stepped down by a speed reducer 35 linked thereto, to set the speed of movement of the movable treatment tank 23 to between 1 mm/s and 20 mm/s. A guide hole 26b for the treatment liquid supply pipeline 30 is also provided in the movable stage 26. The treatment tank arrangement portion 22 and the external drive motor 27 are isolated in a vapor-proof manner by a sealing material 36 such as an O-ring in a linkage portion between the drive motor 27 and the operation arm.

Note that the components provided within the treatment tank arrangement portion 22, such as the movable stage 26, guide shafts 24, and sliding elements 25, are made of a material that has corrosion resistance with respect to the treatment liquid L. In other words, the movable stage 26, sliding elements 25, and operation arm 34 are all made of a PVC material, and the guide shafts 24 are either made of PVC or are or stainless steel coated with Teflon.

Figure 6:
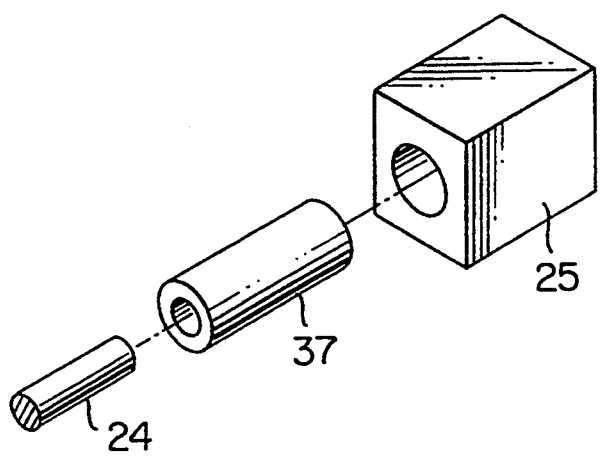
FIG. 6 is an exploded perspective view of a movement guide means for a treatment tank in the cleaning treatment apparatus of the present invention.

In order to facilitate the sliding between the guide shafts 24 and the sliding elements 25, the engagement between each guide shaft 24 and sliding element 25 is through a Teflon collar 37, as shown in FIG. 6. The slider pin 33 that engages with the elongated guide hole 26a provided in the movable stage 26 is made of a similar corrosion-resistant material.

Figure 7:
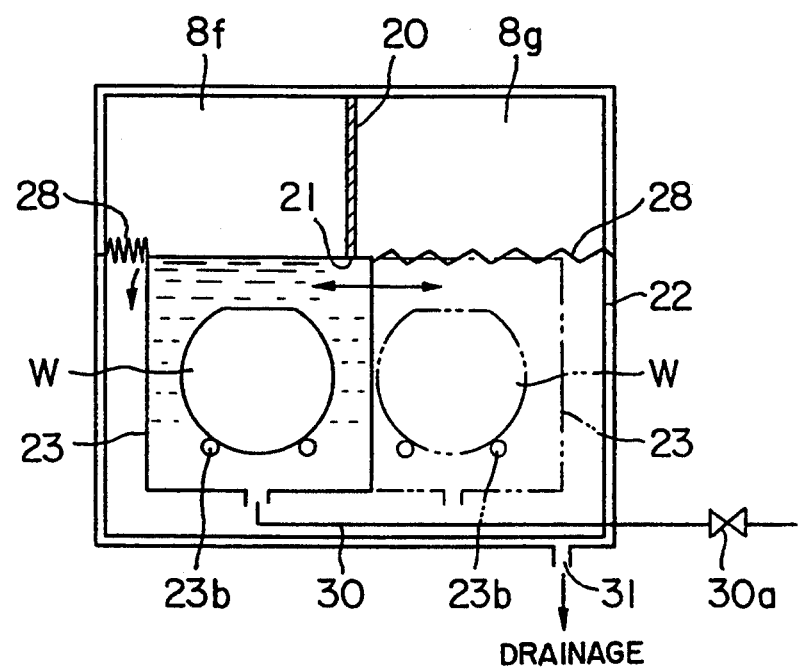
FIG. 7 is an abbreviated cross-sectional view showing the operational status of the cleaning treatment apparatus of the present invention.

The operation of the cleaning treatment apparatus of the present invention will now be described, with reference to the abbreviated cross-sectional view of FIG. 7. Note that the drive portion of the movable treatment tank 23 is omitted from FIG. 7.

First, the wafer conveyor arm 11a loads wafers W onto the wafer support bars 23b in the movable treatment tank 23 that is positioned within the treatment chamber 8f. In this way, the wafers W are immersed in the treatment liquid L supplied into the movable treatment tank 23, to subject them to washing treatment. After the washing treatment has been performed for a predetermined time, or even during the treatment, the drive motor 27 is activated to move the movable treatment tank 23 from the treatment chamber 8f to the neighboring treatment chamber 8g, via the operation arm and the movable stage (not shown in this figure). During this time, the treatment liquid L overflows continuously from the movable treatment tank 23 after being supplied through the treatment liquid supply pipeline 30, so the treatment liquid L and the lower edge portion of the separating wall 20 are in contact as the movable treatment tank 23 passes through the communicating opening 21.

Except for the portion directly above the movable treatment tank 23, the gaps between portions around the movable treatment tank 23 are shut off from the treatment tank arrangement portion 22 by the shutters 28, so that the two treatment chambers 8f and 8g are isolated from each other and thus there is no contamination that would be caused by the atmosphere from one of the two treatment chambers 8f and 8g leaking into the other treatment chamber and mixing therewith. This ensures that after the wafers W have been subjected to the washing treatment by the treatment liquid L supplied to the movable treatment tank 23 that has been moved into the treatment chamber 8g, they can be conveyed to the treatment chamber 8h of the next stage by another wafer conveyor arm 11b. The treatment liquid L that has overflowed drains out from the drain hole 31 in the base of the movable treatment tank 23.

The description of the above embodiment has concerned the application of the cleaning treatment apparatus of the present invention to the third water washing treatment chamber 8f and the fourth water washing treatment chamber 8g, but it should be obvious to those skilled in the art that it can be applied to any neighboring treatment chambers that use the same treatment liquid. The above embodiment also concerned the case in which the movement means of the movable treatment tank 23 converts in a linear manner the rotational action of the drive motor 27 through the operation arm 34 and the elongated guide hole 26a, but it is not limited thereto and thus the movable treatment tank 23 could also be moved by a direct linear action provided by a drive means such as a cylinder operating directly on the movable treatment tank 23. Since the treatment tank itself is moved, the structure of the mechanism required to move the wafers is far simpler than that required when the wafers are supported and moved.

Note the description of the above embodiment assumed that the cleaning treatment apparatus of the present invention was used in a cleaning apparatus for semiconductor wafers, but the present invention is not limited to a cleaning apparatus for semiconductor wafers and it can be applied to other types of cleaning apparatus such a cleaning apparatus for glass LCD substrates or for etching treatment.

As described above, in the cleaning treatment apparatus of the present invention, two neighboring treatment chambers communicate with one another through a communicating opening provided in a lower portion of a separating wall that separates the two treatment chambers, the treatment tank can move between the two treatment chambers, and the treatment liquid in the treatment tank and the separating wall are in direct contact so that the two treatment chambers are isolated from one another, so that mutual contamination of the two treatment chambers is prevented. Therefore, the two treatment chambers can share a single treatment tank used in common, the entire apparatus can be made more compact, and also the amount of treatment liquid used can be reduced. In addition, there is no need for a wafer conveyor means, so throughput can also be improved.

What is claimed is:

1. A cleaning treatment apparatus having a plurality of treatment chambers and a plurality of treatment tanks containing a treatment liquid, wherein an object to be treated undergoes cleaning treatment by being immersed into treatment liquids in said treatment tanks, said apparatus comprising:

a separating wall provided between two neighboring treatment chambers so as to mutually separate said two treatment chambers, a communicating opening being provided at a lower edge of said separating wall in such a manner that said two treatment chambers communicate with one another therethrough; and a movable treatment tank provided to move through said communicating opening between said two treatment chambers for housing an object to be treated, said movable treatment tank having an opening at a top portion thereof;

said movable treatment tank and said separating wall being formed such that, when said movable treatment tank is filled with a treatment liquid and moved through said communicating opening, a lower edge of said separating wall contacts said treatment liquid contained in said movable treatment tank over an entire width of said opening, so that atmospheres in said treatment chambers are mutually isolated.

2. The cleaning treatment apparatus according to claim 1, wherein said movable treatment tank is arranged on a movable stage that has sliding elements that engage in a freely slidable manner with a pair of guide shafts arranged in a lower portion of said treatment tank arrangement portion.

3. The cleaning treatment apparatus according to claim 2, wherein a slider pin engages in a slidable manner in an elongated guide hole formed in said movable stage, and also said slider pin is linked to one end of an operation arm, the other end of said operation arm being linked to a drive motor capable of rotating either clockwise or counterclockwise.

4. The cleaning treatment apparatus according to claim 1, wherein edges of an opening of said movable treatment tank are formed with notches to allow overflow.

5. The cleaning treatment apparatus according to claim 1, wherein the movement of said separating wall is arranged to be freely adjustable in the vertical direction.

6. The cleaning treatment apparatus according to claim 1, further comprising:
   treatment liquid supply pipelines connected to said movable treatment tank.

7. The cleaning treatment apparatus according to claim 1, further comprising:
   a treatment tank arranging portion containing said movable treatment tank, and means for isolating the space between the side wall of said arranging portion and said movable treatment tank.

8. The cleaning treatment apparatus according to claim 7, wherein said isolating means includes a freely extendable and retractable shutter.

9. The cleaning treatment apparatus according to claim 1, further comprising:
   a treatment tank arranging portion containing said movable treatment tank, and treatment liquid exhaust tubes connected to said treatment tank arranging portion.

10. The cleaning treatment apparatus according to claim 1, further comprising:
    a treatment object supporting means provided in said movable treatment tank.

11. The cleaning treatment apparatus according to claim 10, wherein said treatment object supporting means possesses a plurality of notches.

12. The cleaning treatment apparatus according to claim 10, wherein a wafer transport means is provided for shifting said object to be treated to said supporting means.

* * * * *